(12) United States Patent  
Burghartz et al.

(10) Patent No.: US 8,466,037 B2
(45) Date of Patent: *Jun. 18, 2013

(54) METHOD FOR PRODUCING A THIN CHIP COMPRISING AN INTEGRATED CIRCUIT

(75) Inventors: Joachim N. Burghartz, Leinfelden-Echterdingen (DE); Wolfgang Appel, Schwieberdingen (DE); Martin Zimmermann, Stuttgart (DE)

(73) Assignee: Institut fuer Mikroelektronik Stuttgart, Stuttgart (DE)

( * ) Notice: Subject to any disclaimer, the term of this patent is extended or adjusted under 35 U.S.C. 154(b) by 480 days.

This patent is subject to a terminal disclaimer.

(21) Appl. No.: 12/208,585

(22) Filed: Sep. 11, 2008

(65) Prior Publication Data

US 2009/0098708 A1    Apr. 16, 2009

Related U.S. Application Data

(63) Continuation of application No. PCT/EP2007/001887, filed on Mar. 6, 2007.

(30) Foreign Application Priority Data

Mar. 14, 2006  (DE) .......................... 10 2006 013 419
Dec. 8, 2006   (DE) .......................... 10 2006 059 394

(51) Int. Cl.
    *H01L 21/46*     (2006.01)
(52) U.S. Cl.
    USPC ................. 438/458; 257/620; 257/E23.179; 257/E21.524

(58) Field of Classification Search
    USPC ............ 438/458; 257/620, E23.179, E21.524
    See application file for complete search history.

(56) References Cited

U.S. PATENT DOCUMENTS

| 6,165,813 | A  | 12/2000 | Quinn et al.  |
| 6,214,639 | B1 | 4/2001  | Emori et al.  |
| 6,285,072 | B1 | 9/2001  | Maeda         |
| 6,342,433 | B1 | 1/2002  | Ohmi et al.   |

(Continued)

FOREIGN PATENT DOCUMENTS

DE       40 29 973 A1    3/1992
DE      197 52 208 A1    6/1999

(Continued)

OTHER PUBLICATIONS

"A Clean Wafer-Scale Chip-Release Process without Dicing Based on Vapor Phase Etching" by Overstolz et al. Technical Digest, ISBN 0-7803-8265-X, pp. 717-720.*

(Continued)

*Primary Examiner* — Thao Le
*Assistant Examiner* — Matthew Gordon
(74) *Attorney, Agent, or Firm* — Harness, Dickey & Pierce, P.L.C.

(57) ABSTRACT

In a method for producing a very thin chip including an integrated circuit, a circuit structure is produced in a defined section of a semiconductor wafer. The defined wafer section is subsequently released from the semiconductor wafer. For this purpose, the wafer section is firstly freed such that it is held only via local web-like connections on the remaining semiconductor wafer, which web-like connections are arranged at a lateral periphery of the wafer section. The web-like connections are subsequently severed.

18 Claims, 3 Drawing Sheets

U.S. PATENT DOCUMENTS

| | | |
|---|---|---|
| 6,521,068 B1 | 2/2003 | Menschig et al. |
| 6,566,235 B2 | 5/2003 | Nishida et al. |
| 6,677,183 B2 | 1/2004 | Sakaguchi et al. |
| 6,774,010 B2 | 8/2004 | Chu et al. |
| 6,825,057 B1 | 11/2004 | Heyers et al. |
| 6,972,215 B2 | 12/2005 | Sakaguchi et al. |
| 2001/0014516 A1 | 8/2001 | Shimoji |
| 2002/0146893 A1 | 10/2002 | Shimoda et al. |
| 2002/0153595 A1* | 10/2002 | Tayanaka ............. 257/655 |
| 2002/0168796 A1 | 11/2002 | Shimanuki et al. |
| 2004/0082149 A1* | 4/2004 | Sakaguchi et al. ........ 438/458 |
| 2004/0207063 A1 | 10/2004 | Lutter |
| 2005/0029224 A1 | 2/2005 | Aspar et al. |
| 2005/0104223 A1 | 5/2005 | Huang et al. |
| 2005/0124094 A1* | 6/2005 | Hedler et al. ............. 438/114 |
| 2009/0194885 A1 | 8/2009 | Jobetto |

FOREIGN PATENT DOCUMENTS

| | | |
|---|---|---|
| DE | 100 19 705 A1 | 5/2001 |
| EP | 0 957 509 A2 | 11/1999 |
| EP | 1 270 504 A1 | 1/2003 |
| EP | 1 351 292 A2 | 10/2003 |
| FR | 2 823 596 | 10/2002 |
| JP | 48-40373 | 6/1973 |
| JP | 2000-124163 | 4/2000 |
| JP | 2000-173952 | 6/2000 |
| JP | 2002-299500 | 4/2001 |
| JP | 2002-231912 | 8/2002 |
| JP | 2003-31730 | 1/2003 |
| JP | 2004-535664 | 11/2004 |
| WO | WO 96/39710 | 12/1996 |
| WO | WO 2005/104223 | 11/2005 |

OTHER PUBLICATIONS

S. Armbruster et al., "Surface Micromachining of Monocrystalline Silicon Membranes Using a Silicon Micro Grid on Sintered Porous Silicon"; Sep. 2004; pp. 22-23.

C. Berge et al.; "150-mm layer transfer for monocrystalline silicon solar cells"; 2006; pp. 3102-3107.

T. Overstolz et al.; "A Clean Wafer-Scale Chip-Release Process Without Dicing Based On Vapor Phase Etching"; Jan. 2004; pp. 717-720.

Takao Yonehara et al.; "ELTRAN® Novel SOI Wafer Technology"; Jul. 2001; pp. 10-16.

Camille Darnaud-Dufour et al.; "Canon ELTRAN What's SOI"; Feb. 2006; 3 pages.

* cited by examiner

METHOD FOR PRODUCING A THIN CHIP COMPRISING AN INTEGRATED CIRCUIT

CROSSREFERENCE TO RELATED APPLICATIONS

This application is a continuation of international patent application PCT/EP2007/001887, filed on Mar. 6, 2007 designating the U.S., which international patent application has been published in German language as WO 2007/104444 A1 and claims priority from German patent applications DE 10 2006 013 419.2 filed on Mar. 14, 2006 and DE 10 2006 059 394.4 filed on Dec. 8, 2006. The entire contents of these prior applications are incorporated herein by reference.

BACKGROUND OF THE INVENTION

The present invention relates to a method for producing an integrated circuit, and more particularly to a method for producing so-called chips comprising an integrated electronic circuit, wherein the chips and the chip material, respectively, are very thin. Chips according to the invention may have a thickness of significantly less than 300 µm. Advantageously, they have a thickness of approximately 50 µm or less. Such thin chips are well suited for producing so-called 3D chips wherein a plurality of thin chips each comprising an integrated circuit are stacked one on top of the other. Furthermore, such thin chips provide a certain flexibility as a result of the small material thickness, such that they can be used on flexible carrier materials, such as for example a plastic film.

One possible approach for producing such thin chips comprising an integrated circuit consists in firstly producing the integrated circuit on a semiconductor wafer having a thickness of for example 500 µm up to 1 mm. After the integrated circuit has been produced, the rear side of the semiconductor wafer is eroded by a mechanical and/or chemical process. The semiconductor wafer, which typically carries a plurality of integrated circuits, then has to be divided in order to form the chips. This is conventionally done by sawing, grinding, cutting or scribing and breaking. One method for dividing semiconductor wafers to form chips is disclosed by DE 40 29 973 A1.

This approach has the disadvantage that a considerable part of the wafer material is lost due to the erosion. Furthermore, it is necessary to provide relatively large distances between the individual chips on a wafer in order that there is enough space available for sawing, separation by grinding, etc. Typical distances are in this case of an order of magnitude of 500 µm to 1 mm. All this has a disadvantageous effect on the costs for the production of thin integrated circuits, i.e. chips having material thicknesses of less than 150 µm.

WO 2005/104223 A1 describes a method wherein a plurality of vertical trenches are firstly produced at a first surface of the semiconductor wafer by means of an anisotropic etching process. Afterward, the opened first surface is closed off again by means of an epitaxial layer and the semiconductor wafer is subjected to a thermal treatment (annealing). The intention is thereby to form individual closed channels below the first surface. Vertical entrances to the concealed channels are then produced in a further anisotropic etching process. The inner walls of the channels and of the vertical entrances are subsequently provided with an oxide layer by means of an oxidation process. The channels and vertical entrances surround a wafer section at the first surface, in which section a circuit structure is then produced in a conventional manner. Afterward, the oxide layer is removed in the channels and vertical entrances by means of a further etching process, such that the wafer section is connected to the rest of the wafer only via web-like connections on its underside. These connections are broken by tearing out the wafer section upward from the remaining semiconductor wafer, wherein a torsional movement is also proposed. This method allegedly allows the production of chips having a thickness of less than 10 µm.

What appears to be disadvantageous about this method is that the underside of the separated chips typically have a high degree of roughness (compared with the material thickness of the chips) because irregular fracture edges of the former web-like connections remain on the underside of the wafer section. Moreover, producing the deeply situated oxide layers below the wafer section and selectively etching them out later are complicated and difficult.

A paper by Overstolz et al. entitled "A Clean Wafer-Scale Chip-Release Process without Dicing Based on Vapor Phase Etching", 17th IEEE International Conference on Micro Electro Mechanical Systems, January 2004, pages 717 to 720, discloses releasing a micromechanical sensor, namely an inclinometer, from a silicon material solely by means of various etching processes. In this case, an SOI wafer (Silicon on Insulator) serves as the starting material. In order to release the inclination sensor, trenches and holes are etched both from the front side and from the rear side of the wafer material. In addition, the oxide layer lying in the semiconductor material is partially etched out by introducing hydrofluoric acid vapor through the holes at the front side and rear side into the interior of the semiconductor wafer.

U.S. Pat. No. 6,165,813 discloses a method for releasing thin chips fixed to a flexible substrate by bending the substrate. U.S. Pat. No. 6,521,068 discloses a method for separating chips from a substrate, wherein a region below the chip is heated by a laser.

JP 2002-299500 describes the removal of chips by means of a so-called dummy substrate.

In another field of the art, production and use of porous silicon is known. DE 197 52 208 A1 discloses a method for producing a membrane sensor, wherein a thin layer of silicon carbide or silicon nitrite is deposited over a region of porous silicon. The porous silicon is subsequently removed as sacrificial material using ammonia. As a result, a cavity arises below the membrane layer of silicon carbide or silicon nitrite, which cavity thermally decouples the sensor membrane from the remaining substrate.

Furthermore, porous silicon is used in the so-called ELT-RAN process (Epitaxial Layer TRANsfer), which can be used to produce SOI wafers. The procedure is described in a publication by T. Yonehara and K. Sakaguchi that appeared in JSAP International No. 4, July 2001, entitled "ELTRAN; Novel SOI-Wafer Technology".

SUMMARY OF THE INVENTION

Against this background it is an object of the present invention to provide an alternative method for producing thin chips having integrated circuits in a cost-effective manner.

It is another object to provide a method for producing thin chips including an integrated circuit with high quality and high yield.

According to one aspect of the invention, there is provided a method for producing a thin film chip comprising an integrated circuit, the method comprising the steps of providing a semiconductor wafer having a top side and a bottom side, producing a plurality of hidden wafer cavities near the top side, defining a plurality of wafer sections at the top side, with each wafer section having a lateral periphery and lying above a hidden wafer cavity, producing at least one circuit structure in at least one defined wafer section, and separating the defined wafer section from the semiconductor wafer, wherein the step of separating includes a first process sequence, wherein trenches down to the hidden cavities are produced such that the defined wafer section is held on the semiconductor wafer only via local web-like connections, which are arranged at the lateral periphery, and wherein the web-like connections are severed in a second process sequence.

According to another aspect, there is provided a method for producing a thin film chip comprising an integrated circuit, the method comprising the steps of providing a semiconductor wafer having a top surface and a bottom surface, defining a plurality of wafer sections at the top surface, with each wafer section having a lateral periphery, producing at least one circuit structure in at least one defined wafer section, and releasing the defined wafer section from the semiconductor wafer, wherein the defined wafer section is freed in a first process sequence such that the wafer section is held on the remaining semiconductor wafer via local web-like connections, which are arranged at the lateral periphery, and wherein the web-like connections are severed in a second process sequence.

The new methods differ from the method of WO 2005/104223 A1 mentioned above in that the supporting web-like connections for holding the wafer section prior to the final separation step act essentially laterally on the wafer section. The web-like connections preferably hold the wafer section at a plurality of opposite corners or sides, wherein they surround the wafer section. In some refinements of the invention, the web-like connections may be arranged at the corners of a rectangular wafer section. In other refinements, the web-like connections may be situated at the longitudinal sides of a rectangular wafer section. However, the new methods are not restricted to rectangular wafer sections (and corresponding chips). By way of example, web-like connections may also be arranged at the outer circumference of a wafer section having a round or elliptical base area.

The new methods do not rule out a situation in which there are also some web-like connections below the wafer section to be released. In fact, there may "survive" some few connections at the underside of the wafer section in some preferred embodiments of the new method using porous silicon. However, this is to be seen as a process dependent "residual effect", which does not contradict the above. Primarily, the wafer section according to the new methods is held by the local web-like connections arranged at its lateral periphery.

The new type of "suspension" of the wafer section at its periphery makes it possible to press the wafer section into the semiconductor wafer in order to break the web-like connections. Therefore, the wafer section can be broken out from the remaining material of the semiconductor wafer by a pressure force from above. In contrast to this, the method according to WO 2005/104223 A1 mentioned at the beginning requires a tensile force which has to be strong enough to sever the web-like connections in the longitudinal direction thereof. In contrast, in the new method it is possible to use shear forces for severing the web-like connections. If it is taken into account that the wafer section is very thin in preferred refinements of the invention (material thickness smaller than 150 µm and preferably in the range below 50 µm), it is evident that the risk of damage to the wafer section is lower in the case of the new method. Furthermore, the separating points lie at the lateral periphery of the wafer section, which can be at a certain distance from the sensitive circuit structures in the wafer section. By contrast, the forcibly ruptured separating points lie directly below the sensitive circuit structures in the case of the known method.

The new methods therefore allow to significantly reduce the risk of the wafer section being damaged during the separation step. Furthermore, the separation step can be performed in a very cost-effective manner by means of known apparatuses used for the handling and placement of SMD (Surface Mounted Devices) components in preferred refinements.

Moreover, the new method has the advantage that the remaining semiconductor wafer can be used again for producing integrated circuits if the remaining web residues at the first surface are ground away. The semiconductor wafer is thus utilized optimally. The production costs for thin integrated circuits can be reduced.

Finally, the new method has the advantage that the underside of the wafer sections is (at least substantially) free of breaking points and artefacts, so that the wafer section or the chip can be subjected to further processing more easily and more exactly, e.g. in the case of stacking one on top of another for a 3D chip or in the case of arrangement on a thin foil.

In summary, the new methods thus enable a cost-effective and high-quality production of thin integrated circuit chips. Therefore, the above object is completely achieved.

As already mentioned above, the web-like connections are broken by means of a pressure applied from above in preferred refinements. Alternatively or in addition to this, the web-like connections may also be broken by means of a torsion movement.

This refinement enables the wafer sections to be handled by means of gripping tools such as are also used for the handling of SMD components. A particularly cost-effective and efficient production of thin chips is thus possible.

In a particularly preferred refinement, the first process sequence comprises producing a closed wafer cavity below the defined wafer section. Preferably, the circuit structure is produced above the closed wafer cavity.

The realization of the new method with a closed cavity has the advantage that the semiconductor wafer can be stored in stock despite the cavity (or with a plurality of such cavities for a plurality of such wafer sections), whereby the production process can be further rationalized and made even more cost-effective.

In a further refinement, producing the wafer cavity comprises the following steps: providing a substrate wafer having a top side composed of a first semiconductor material, in particular a highly p-doped silicon, producing a plurality of porous regions in the first semiconductor material, wherein each porous region has an area extent corresponding approximately to the area extent of the defined wafer section, and producing a cover layer on the top side, which covers the porous regions.

Preferably, the cover layer covers the entire surface of the semiconductor wafer, such that externally the semiconductor wafer is virtually or completely indistinguishable from a semiconductor wafer without cavities.

Suitable wafer cavities can be produced very cost-effectively with this refinement. Therefore, this refinement is particularly advantageous for mass production of integrated circuits.

In a further refinement, each porous region is produced with a large-pored lower layer and a fine-pored upper layer.

The penetration depth and pore size of the layers can be varied during the production of the porous regions e.g. varying the current density of a current that flows through a solution composed of hydrofluoric acid and ethanol in which the substrate wafer composed of monocrystalline silicon is arranged as anode (cf. the publication by Yonehara/Sakaguchi which is incorporated here by reference). By producing a large-pored lower layer and a fine-pored upper layer, the wafer cavity can be closed off toward the top more simply. At the bottom a large-pored lower layer serves to ensure that the wafer section "floats" as freely as possible above the rest of the wafer material. The larger the pore size here, the less the extent to which the wafer section is connected to the underlying wafer material.

In a further refinement, the substrate wafer is heated after the porous regions have been produced, in order to produce the cover layer.

In this refinement, the substrate wafer is subjected to a thermal treatment (annealing) after the porous regions have been produced. As a result, the pores close at the top side. Moreover, the pore size can thus additionally be increased in the more deeply situated regions. A kind of reflow process takes place, by means of which the (preferably fine-pored) material at the top side is transformed into a monocrystalline structure again. The material required for this purpose originates from the more deeply situated, preferably large-pored layer. This refinement is particularly advantageous for producing a suitable cavity in a cost-effective manner.

In a further refinement, a second semiconductor material is applied to the top side in order to produce the cover layer. In preferred embodiments of the invention, an epitaxial layer is grown onto the topmost crystalline layer, which was produced above the cavity by means of the reflow process just described.

This refinement facilities the later production of the circuit structures in the wafer section because the circuit structures can be produced in a "conventional" monocrystalline semiconductor material. Therefore, the new method in this refinement can be integrated into existing production processes in a particularly simple manner.

In a further refinement, the substrate wafer comprises a third semiconductor material, preferably a more lightly p-doped semiconductor material (for example silicon), which is arranged below the first semiconductor material (preferably highly p-doped silicon), wherein the porous regions are produced only in the first semiconductor material.

This refinement is particularly advantageous in order to obtain a surface that is as planar as possible above the cavities. This is because it is advantageous to use a highly p-doped silicon for the production of the porous layers. By contrast, often less highly doped regions are required for the circuit structure. It is advantageous, therefore, to apply the epitaxial layer already mentioned on the top side of the semiconductor wafer. However, different high dopings can bring about stresses in the material as a result of different lattice constants. These stresses can have the consequence that the surface of the semiconductor wafer becomes undulated. By virtue of the porous regions now being produced in a highly doped layer arranged on a third semiconductor material, it is possible, through a suitable choice of the process parameters, to ensure that the lattice constants of the materials are better matched to one another after the production of the porous layer. Stresses and resultant undulations can be at least reduced as a result.

In a further refinement of the invention, the wafer section is freed from the second surface in the first process sequence.

In this refinement, material beneath the wafer section to be released is removed from below, that is to say from the second surface. This can be done in addition to a cavity below the wafer section. However, this refinement is preferably realized without a cavity below the wafer section. This refinement of the method is preferably realized with an SOI wafer, wherein the wafer section with the circuit structures is formed in the upper semiconductor layer of the SOI wafer and wherein the lower material layer (bulk silicon) is etched out before or after the production of the circuit structures.

This refinement is advantageous in order to obtain a very smooth surface on the underside of the wafer section. Accordingly, this refinement is particularly suitable for applications which make very stringent requirements of the surface quality of the rear side of the chip. Nevertheless, this refinement also makes use of the fundamental advantages of the new method, in particular the possibility of separating the chips by means of conventional SMD gripping tools and processing them further.

In a further refinement, the first process sequence comprises producing trenches at the first surface of the semiconductor wafer after the circuit structure has been produced in the wafer section.

In this refinement, the first process sequence can be divided into two subsequences, namely in at least two stages that are temporally separate from one another. This is the case, for example, if the wafer section is freed by means of a cavity that is advantageously produced before the circuit structures are produced in the wafer section. On the other hand, according to this refinement of the method the trenches are etched or produced in some other way after the circuit structure has been produced. However, the present refinement is also advantageous in the alternative variants of the new method in which a cavity is dispensed with. Generally, the refinement has the advantage that the production of the integrated circuit can be integrated into existing manufacturing sequences more simply and thus more cost-effectively since the semiconductor wafer has an (at least substantially) closed surface during the production of the circuit structures.

In a further refinement, a semiconductor wafer is provided which has at least one upper, one middle and one lower material layer, wherein the circuit structure is produced in the upper material layer, and wherein the middle material layer is etched out in the first process step in order to free the wafer section. In this refinement an SOI wafer is preferably used as starting material.

As already mentioned further above, chips having a very smooth and high-quality rear side can be produced by means of a multilayered semiconductor wafer. The use of an SOI starting material furthermore contributes to a reduction of the production costs because SOI wafers are available cost-effectively as standard products.

In a further refinement, at least one passage opening is produced in the wafer section in order to pass an etchant to the middle material layer.

This refinement is advantageous because it facilitates an exact "under-cutting" of the wafer section, particularly if the wafer section has laterally an extent that is significantly larger than the thickness of the second material layer. The production of the integrated circuits is accelerated in this way and the yield is increased.

In a further refinement, the wafer section is arranged in the [100] direction or in the [110] direction in the semiconductor wafer, and the web-like connections are arranged at corners or at lateral edges of the wafer section.

Since in particular the breaking behavior of semiconductor wafers differs depending on the position of a fracture edge relative to the crystal lattice, this refinement makes it possible to influence the forces required for severing the connections and also the formation of the separating points. An optimum release of the wafer section can be achieved with the preferred refinement.

It goes without saying that the features mentioned above and those yet to be explained below can be used not only in the

BRIEF DESCRIPTION OF THE DRAWING

Exemplary embodiments of the invention are illustrated in the drawing and are explained in more detail in the description below. In the drawing.

DESCRIPTION OF PREFERRED EMBODIMENTS

Figure 1:
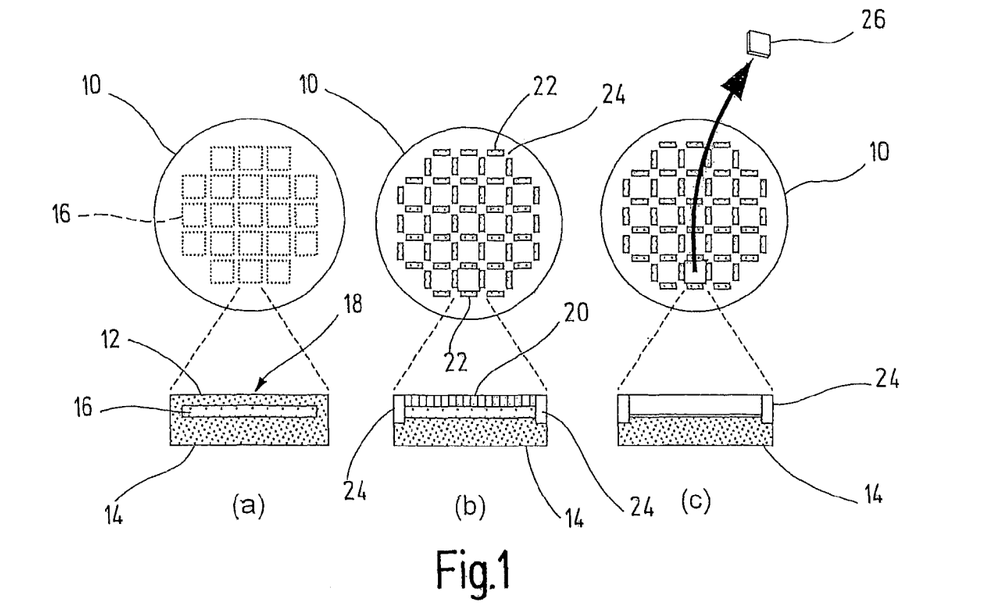
FIG. 1 shows a simplified, schematic illustration for explaining a first exemplary embodiment of the method according to the present invention.

In FIG. 1, a semiconductor wafer is designated by reference number 10. The semiconductor wafer 10 has a first or top surface 12 and an opposite second (bottom) surface 14. A cavity 16 is arranged below the first surface 12, such that a wafer section 18 is supported in "suspended" fashion above the cavity. As is illustrated in FIG. 1a), the semiconductor wafer has a plurality of such cavities 16 which are concealed or hidden within the semiconductor material.

In a first exemplary embodiment, such a semiconductor wafer 10 is provided (FIG. 1a). Afterward, a circuit structure is produced in a conventional manner in the respective wafer sections 18 above the cavities 16. The circuit structure is illustrated schematically with reference numeral 20 in FIG. 1b. In the preferred embodiments, it lies in the [100] or [110] direction relative to the crystal lattice of the wafer material. The wafer section 18 with the circuit structure 20 forms a future chip comprising an integrated circuit, which then has to be released from the semiconductor wafer 10.

In the exemplary embodiment shown, this is done by a plurality of trenches 22 being etched into the surface 12 of the semiconductor wafer 10, wherein the individual trenches 22 are separated from one another by web-like regions 24. In a preferred exemplary embodiment, the trenches 22 are arranged in lattice-like fashion on the surface 12 of the semiconductor wafer 10 and they form a pattern of vertical and horizontal trenches. Where a vertical and a horizontal trench 22 meet, a web-like region 24 that was not etched out has remained. Four trenches in each case surround a wafer section 18 with the integrated circuit structure 20. Accordingly, here each wafer section 18 is held by the web-like connections 24 only at its four corners. As an alternative, the wafer sections 18 could also be held via web-like connections which are not arranged at the corners but rather for example centrally at the lateral edges of each wafer section 18.

As is illustrated in FIG. 1c, the individual wafer sections 18 can be broken out from the lattice grid of the trenches 22, and chips 26 comprising an integrated semiconductor structure are obtained in this way.

Figure 2:
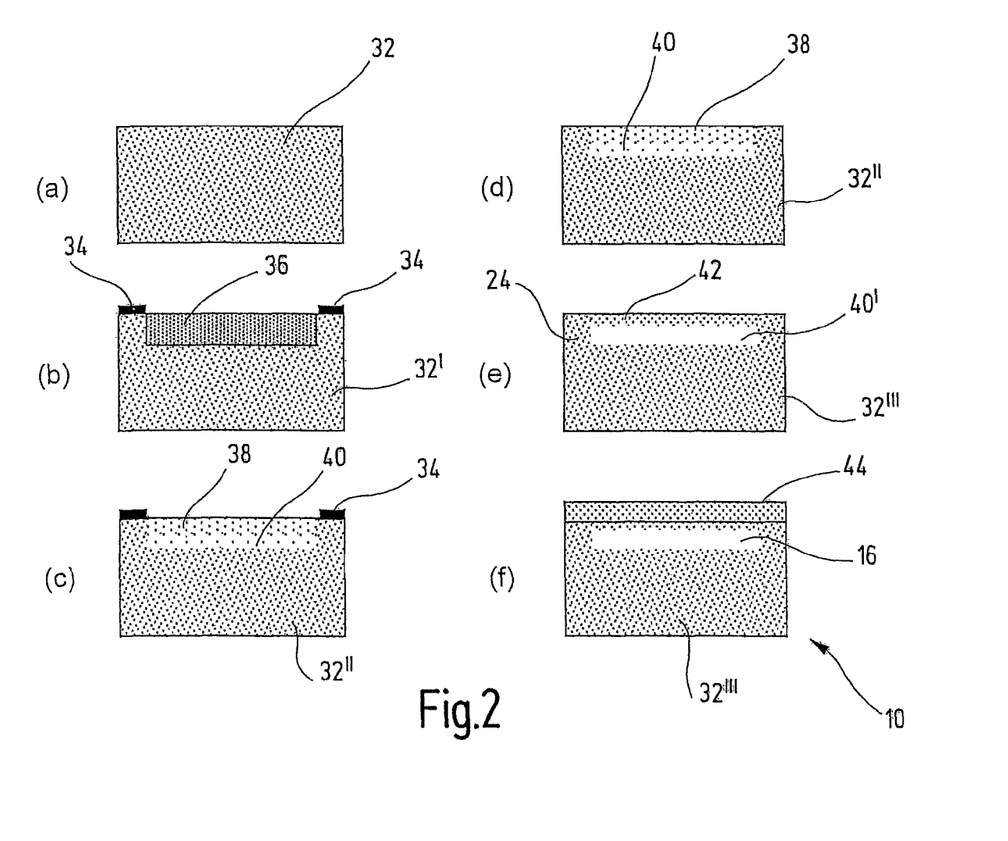
FIG. 2 shows a simplified illustration for explaining a variant of the method in which a wafer cavity is produced below the wafer section.

FIG. 2 shows a preferred exemplary embodiment for producing a semiconductor wafer 10 according to FIG. 1. In accordance with FIG. 2a, firstly a substrate wafer 32 is provided, which is composed e.g. of monocrystalline, weakly p-doped silicon. In accordance with FIG. 2b, the substrate wafer 32 is provided with a photomask 34 and exposed. The photomask 34 covers the surface of the substrate wafer 32 only partially and the open locations can be processed in a known manner.

In the exemplary embodiment illustrated, the substrate wafer 32 is p-doped through the mask 34 in order to obtain a highly p-doped semiconductor region 36. The underlying substrate material 32' still has only a lower p-type doping.

In accordance with FIG. 2c, porous layers 38, 40 are subsequently produced in the highly doped semiconductor material 36. For this purpose, in a preferred exemplary embodiment the substrate wafer is arranged as anode in a solution composed of hydrofluoric acid and ethanol, such that a current can flow through the solution to the substrate wafer. As a result, porous silicon forms in the region of the highly doped semiconductor material 36, wherein the pore size can be altered by varying the current density. In the preferred exemplary embodiment, a fine-pored layer 38 is produced at the surface of the substrate wafer and a large-pored layer 40 is produced underneath. A somewhat more detailed description of the production of these layers is given in the publication by Yonehara/Sakaguchi mentioned at the beginning, which publication is incorporated by reference here.

In accordance with FIG. 2d, the photomask 34 is subsequently removed and the wafer 32" with the porous layers 38, 40 is subjected to a thermal treatment. The consequence of this is that the pores in the upper fine-pored layer 38 at least partly close again and the upper layer 38 is transformed again into a substantially uniform, monocrystalline layer 42, below which lies the large-pored layer 40', the pore size of which has additionally increased. The large-pored layer 40 now forms the cavity that is designated by reference number 16 in FIG. 1. Isolated webs (not illustrated here) that connect the upper layer 42 to the substrate material 32''' situated at the bottom may also have remained within said cavity. However, such webs are the consequence of process fluctuations and practical inadequacies when producing the cavity 16. The wafer section 18 from FIG. 1 is held primarily by the webs 24 which have remained laterally alongside the cavity 16 and have been left on account of the mask structure 34.

In accordance with FIG. 2f, the next step involves applying a further layer 44 as cover layer to the surface of the substrate material 32'''. In a preferred exemplary embodiment, this involves an epitaxial layer composed of monocrystalline, moderately p-doped silicon, which is grown on the layer 42 or on the entire surface of the semiconductor wafer. This results in a semiconductor wafer 10 that is provided as starting material for the process step 10 in accordance with FIG. 1.

As can be seen from the joint consideration of FIGS. 1 and 2, the lateral area extent of the porous layers 38, 40 corresponds approximately to the lateral area extent of the cavity 16 and in this respect also approximately to the lateral area extent of the wafer section 18 in which the circuit structure 22 is produced. Therefore, the lateral area extent of the porous layers 38, 40 also determines the chip area of the later chip 26.

Figure 3:
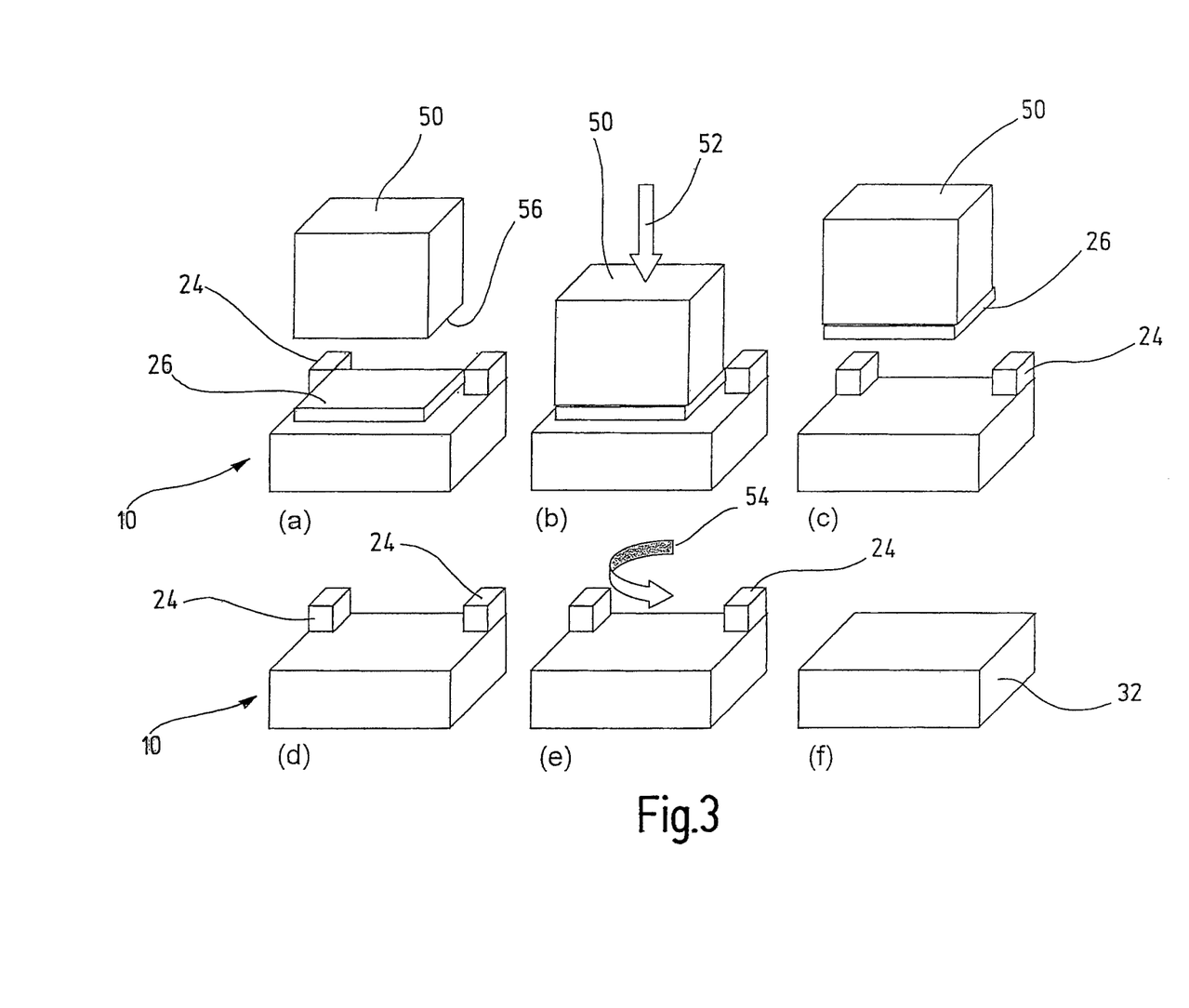
FIG. 3 shows a schematic illustration of the separation of the chips in an exemplary embodiment of the method according to the present invention.

FIG. 3 shows a preferred exemplary embodiment for separating the chips 26. According to this, the individual chips are grasped by means of a gripping tool 50, which sucks up the chips 26 (more precisely, the wafer sections 18 which are still suspended on the web-like connections 24), by vacuum. Through pressure from above (arrow 54), the web-like connections 24 are broken by the individual chip 26 being pressed downward into the cavity. The chip 26 can subsequently be taken off upward by means of the gripping tool 50 and be processed further. Alternatively or in addition, the chip 26 can also be broken out from the wafer 10 by tensile forces and/or torsion forces.

The advantages of the method illustrated in FIGS. 1 and 2 include the fact that the remaining semiconductor wafer 10 can be recycled after all the chips 26 have been removed. For this purpose, the semiconductor wafer 10 with the residual web regions 24 (FIG. 3d) is ground and polished on its top side, which is symbolically illustrated at reference number 54 in FIG. 3e. This results in a (somewhat thinner) substrate wafer 32, which can be subjected again to the process sequence from FIG. 2.

As is illustrated in FIG. 3, the gripping tool 50 grips the individual chips 26 substantially congruently. Accordingly, the gripping tool 50, in the region of its lower gripping area 56, is made approximately just as large as the lateral area extent of the chip 26. As a result, the gripping tool 50 can securely hold the sensitive chips 26. The risk of damage in the course of breaking out from the semiconductor wafer 10 is minimized further.

Figure 4:
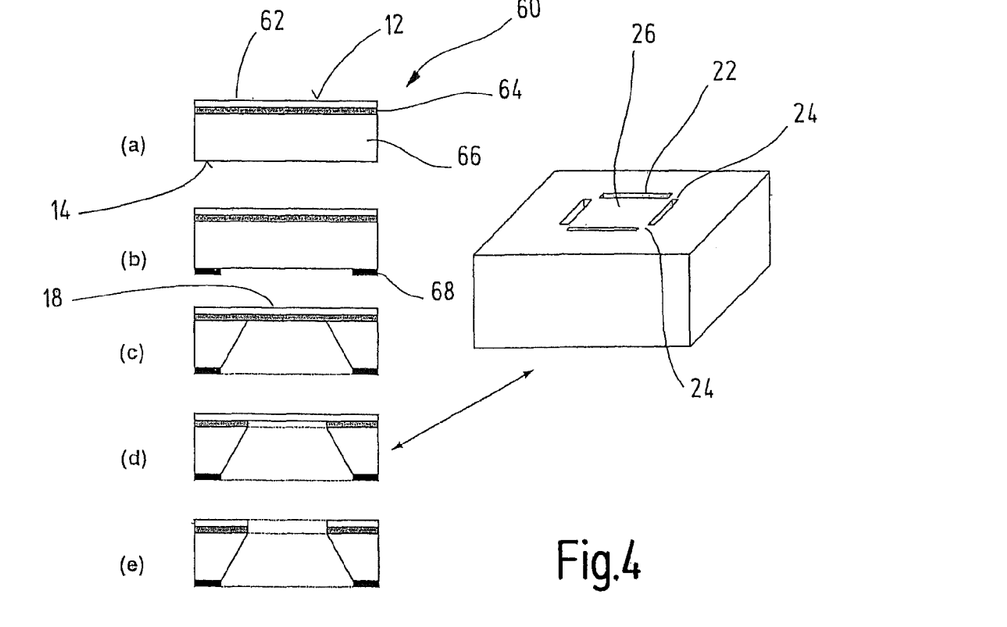
FIG. 4 shows a schematic illustration for explaining a further exemplary embodiment of the method according to the present invention.

FIG. 4 shows another embodiment of the new method. Here a semiconductor wafer 60 is provided as starting material, the said wafer having an upper material layer 62, a middle material layer 64 and a lower material layer 66. In a preferred exemplary embodiment, an SOI wafer is involved in which the upper and the lower material layer 62, 66 are composed of monocrystalline silicon, while the middle material layer 64 is composed of silicon dioxide. In general, it is preferred if the upper material layer 62 and the middle material layer 64 are relatively thin in comparison with the lower material layer 66.

In accordance with FIG. 4b, the semiconductor wafer 60 (before or after the production of the circuit structure, which is not illustrated here for reasons of clarity) is provided with a photomask 68 on its underside, which photomask leaves free a region below the future chip 26. Afterward, in accordance with FIG. 4c, the lower material layer is removed insofar as it is not covered by the photomask 68. In the exemplary embodiment illustrated, the lower material layer 66 is removed by means of an etching process which is stopped when the middle material layer 64 is reached. A chemical wet or dry etching method can be used.

In accordance with FIG. 4d, the next step involves removing the middle material layer insofar as it was uncovered by the removal of the lower material layer 66. The (future) chip 26 is now held only laterally, as is illustrated in FIG. 4d. The next step involves producing trenches 22, wherein only web-like connections 24 remain. The trenches can be introduced after the process step illustrated in FIG. 4c or else earlier.

The chip 26 is subsequently broken out from the semiconductor wafer 60, as is illustrated in FIG. 3.

Alternatively or in addition, the middle material layer 64 can also remain wholly or partially in order to form web-like connections between the chip 26 and the rest of the wafer material. In this case, the trenches 22 in the upper material layer 62 can surround the entire chip area (not illustrated here). The web-like connections 24 then lie below the surface 12 in the middle material layer 64, but still at the periphery of the future chip 26.

Figure 5:
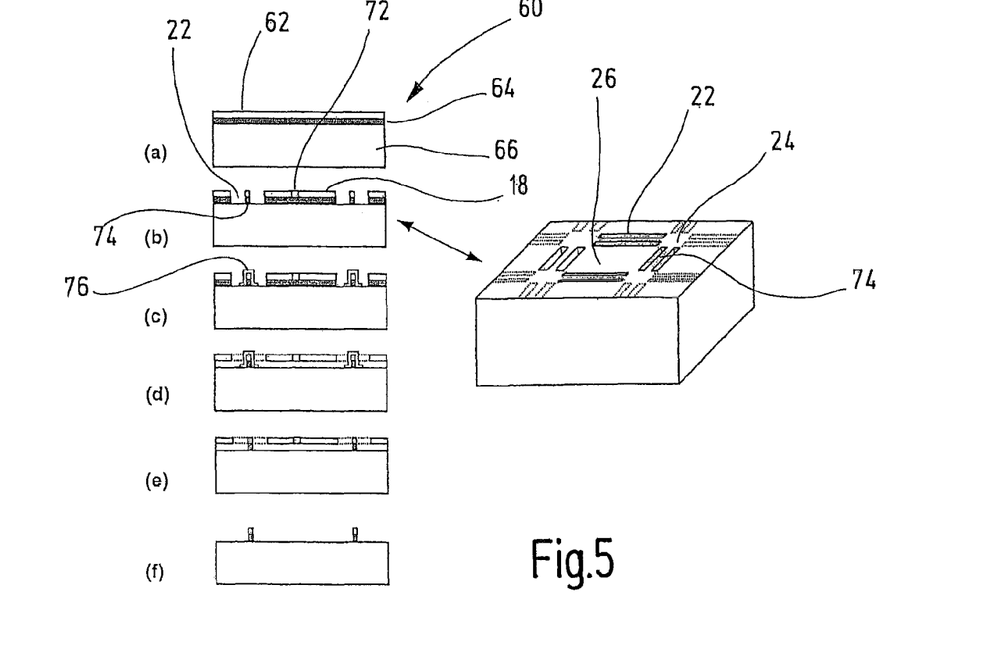
FIG. 5 shows a schematic illustration for explaining a further exemplary embodiment of the method according to the present invention.

FIG. 5 shows a further exemplary embodiment, in which a semiconductor wafer 60 having at least three material layers 62, 64, 66 arranged one above the other is used as starting material. In this case, too, an SOI wafer is suitable as starting material.

In accordance with FIG. 5b, trenches 22 are etched into the two upper material layers 62, 64 from above, such that only web-like connections 24 remain which, in the exemplary embodiment illustrated, also once again lie in the corner regions at which trenches 22 running toward one another meet. As is illustrated in FIG. 5b, the trenches 22 reach down as far as the lower material layer 66.

The trenches 22 are once again arranged in the form of a lattice grid, such that rectangular regions arise in which the circuit structures (not illustrated here) are produced in a conventional manner. It is preferred if the circuit structures are produced prior to the etching of the trenches 22 in the upper material layer 62 of the semiconductor wafer 60.

In preferred variants of this exemplary embodiment, passage openings 72 are additionally etched in the region of the chip area 26, wherein the openings 72 only reach through the upper material layer 62. This produces an entrance to the middle material layer 64 in the region of the chip area 26.

As can be seen in FIG. 5b, in this exemplary embodiment in each case two trenches 22 are etched in parallel fashion alongside one another, such that a narrow web region 72 remains between the two parallel trenches 22. In accordance with FIG. 5c, these web regions 74 are subsequently covered with a photomask 76 formed in such a way that it does not cover the uncovered sides of the chip area 26.

In accordance with FIG. 5d), the middle material layer (oxide layer) is then removed by means of hydrofluoric acid. The chips 26 are thus suspended only on the web-like connections 24 in the corner regions. The chips 26 can then be released in the same way as explained with reference to FIG. 3. The remaining semiconductor wafer (FIG. 5f) can subsequently be recycled again and utilized for a new production process.

What is claimed is:

1. A method for producing a plurality of thin film chips, each comprising an integrated circuit, the method comprising the steps of:
   providing a semiconductor wafer having a top side and a bottom side,
   producing a plurality of closed hidden wafer cavities near the top side, said closed hidden wafer cavities each having a lateral area extent that defines the chip area of one of said thin film chips above the respective wafer cavity, such that each chip area is substantially unsupported beneath the chip area,
   producing at least one integrated circuit structure in at least one defined chip area suspended above a respective wafer cavity, and
   separating the defined chip area from the semiconductor wafer,
   wherein the step of separating includes a first process sequence, wherein a plurality of trenches down to the closed hidden cavities are produced along a substantial majority portion of the entire lateral periphery of said defined chiparea such that the defined chip area is primarily held on the semiconductor wafer via separated, residual web-like connections, which are arranged at the lateral periphery of said chip area above the respective wafer cavity, and
   wherein the web-like connections are severed in a second process sequence by breaking the web-like connections.

2. The method of claim 1, wherein the web-like connections are broken by means of a pressure applied to the defined chip area rom above.

3. The method of claim 1, wherein the semiconductor wafer comprises a first semiconductor material at the top side and a second semiconductor material at the bottom side, and the step of producing the wafer cavities comprises the steps of:

producing a plurality of porous regions in the first semiconductor material, and producing a cover layer on the top side, which covers the porous regions.

4. The method of claim 3, wherein each porous region is produced with a large-pored lower layer and a fine-pored upper layer.

5. The method of claim 4, wherein the wafer is heated after the porous regions have been produced, in order to produce the cover layer by thermally induced reflow of semiconductor material from the large-pored lower layer to the fine-pored upper layer.

6. The method of claim 4, wherein an epitaxial layer is grown at the top side in order to produce the cover layer.

7. A method for producing a thin film chips, each comprising an integrated circuit, the method comprising the steps of:

providing a semiconductor wafer having a top surface and a bottom surface, the semiconductor wafer being composed of a first semiconductor material at the top surface, defining a plurality of chip areas at the top surface, with each chip area having a lateral periphery that defines one of said thin film chips, producing at least one integrated circuit structure in at least one defined chip area, and releasing the defined chip area from the semiconductor wafer, wherein the step of defining the plurality of chip areas comprises a step of producing a plurality of closed wafer cavities below the top surface by producing a plurality of porous regions in the first semiconductor material, with each porous region laterally extending below and matching a defined chip area such that each chip area ia substantially unsupported beneath the chip area, and by producing a voer layer covering the porour regions so as to form the closed wafer cavities below the top surface, wherein the defined chip area is freed in a first process sequence such that the chip area is held on the remaining semiconductor wafer primarily via spaced apart web-like connections in said cover layer, which are arranged along minor portions of the lateral periphery above the respective wafer cavity, and wherein the web-like connections are severed in a second process sequence.

8. The method of claim 7, wherein the web-like connections are broken by means of a pressure applied to the defined wafer section from the top surface.

9. The method of claim 7, wherein the circuit structure is produced above the closed wafer cavity.

10. The method of claim 7, wherein each porous

11. The method of claim 7, wherein the wafer is heated after the porous regions have been produced, in order to produce the cover layer.

12. The method of claim 7, wherein a second semiconductor material is applied to the top side in order to produce the cover layer.

13. The method of claim 12, wherein the wafer comprises a third semiconductor material, which is arranged below the first semiconductor material, and wherein the porous regions are produced only in the first semiconductor material.

14. The method of claim 7, wherein the wafer section is freed from the top surface in the first process sequence.

15. The method of claim 7, wherein the first process sequence comprises a step of producing trenches at the top surface after the circuit structure has been produced in the defined chip area, the trenches surrounding the defined wafer section.

16. The method of claim 15, wherein the semiconductor wafer has at least one upper, one middle and one lower material layer, wherein the circuit structure is produced in the upper material layer, and wherein the middle material layer is etched out in the first process sequence in order to free the chip area.

17. The method of claim 16, wherein at least one passage opening is produced in the defined chip area in order to pass an etchant to the middle material layer.

18. The method of claim 1, wherein the semiconductor wafer comprises a crystal lattice having a [100] direction and a [110] direction, wherein the defined chip area is arranged parallel to the [100] direction or parallel to the [110] direction, and wherein the web-like connections are arranged at corners or at lateral edges of the defined wafer section.

* * * * *

UNITED STATES PATENT AND TRADEMARK OFFICE
CERTIFICATE OF CORRECTION

PATENT NO. : 8,466,037 B2
APPLICATION NO. : 12/208585
DATED : June 18, 2013
INVENTOR(S) : Joachim N. Burghartz Page 1 of 1

It is certified that error appears in the above-identified patent and that said Letters Patent is hereby corrected as shown below:

In the Claims

Column 10,
Line 53 Claim 1, "chiparea" should be -- chip area --.
Line 62 Claim 2, "rom" should be -- from --.

Column 11,
Line 15 Claim 7, after "a" insert -- plurality of --.
Line 33 Claim 7, "ia" should be -- is a --.
Line 35 Claim 7, "voer" should be -- cover --.
Line 35 Claim 7, "porour" should be -- porous --.

Column 12,
Line 8 Claim 10, after "porous" insert -- region is produced with a large-pored lower layer and a fine-pored upper layer. --.
Line 40 Claim 18, "wafer section" should be -- chip area --.

Signed and Sealed this
Twenty-second Day of October, 2013

Teresa Stanek Rea
*Deputy Director of the United States Patent and Trademark Office*